United States Patent
Cheng et al.

(10) Patent No.: US 6,942,514 B1
(45) Date of Patent: Sep. 13, 2005

(54) QUICK RELEASE CONNECTOR FOR CONNECTING TERMINAL BOARD

(75) Inventors: Tsung-Kan Cheng, Taipei (TW); Tony Chang, Miao-Li Hsien (TW); Forli Wen, Hsinchu (TW)

(73) Assignee: C-One Technology Corporation, Hsinchu (TW)

( * ) Notice: Subject to any disclaimer, the term of this patent is extended or adjusted under 35 U.S.C. 154(b) by 0 days.

(21) Appl. No.: 10/795,182

(22) Filed: Mar. 4, 2004

(51) Int. Cl.[7] ............................................. H01R 12/18
(52) U.S. Cl. ........................................ 439/328; 439/59
(58) Field of Search ............................ 439/59, 62, 157, 439/328, 325, 327

(56) References Cited

U.S. PATENT DOCUMENTS 4,490,003 A * 12/1984 Robinson .................... 439/325
5,043,562 A * 8/1991 Hautvast et al. ............ 439/328

* cited by examiner

Primary Examiner—Renee Luebke

(57) ABSTRACT

A connector for electrically connecting a terminal board includes a base having a plurality of contact terminals extending through a rear frame of the base which is received in a case so that the terminal board can be inserted through an elongated hole in the case to contact with the contact terminals. Two release plates extend through two slots defined in two side frames of the base and each has a hook so as to hook respective ones of two recesses of the terminal board. A spring is connected between the two release plates so that when the two release plates are pushed toward each other, the two hooks are disengaged from the recesses of the terminal board and the connector is easily removed from the terminal board.

7 Claims, 5 Drawing Sheets

QUICK RELEASE CONNECTOR FOR CONNECTING TERMINAL BOARD

FIELD OF THE INVENTION

The present invention relates to a connector that includes two release plates with a spring biased therebetween for quickly connecting to or releasing from a terminal board.

BACKGROUND OF THE INVENTION

A conventional connector used in an electrical or electronic equipment generally includes a flexible case which is squeezed to force the contact terminals to be connected with the terminal board. It requires a lot of force to engage the connector with or disengaged from the terminal board. Often, the contact terminals of the connector are bent or even broken. It is inconvenient for the assemblers to assemble the connectors and the terminal boards.

The present invention intends to provide a quick release connector which has two release plates each having a hook for engaging with the terminal board and a spring biased toward the two release plates so that when the two release plates are pushed toward each other, the two hooks are moved away from the terminal board and the connector is disengaged from the terminal board.

SUMMARY OF THE INVENTION

The present invention relates to a connector that includes a base having a plurality of contact terminals extending through a rear frame thereof and two side frames are connected to the rear frame so that one of two ends of the contact terminals are located between the two side frames. Each side frame has a slot defined therein so as to receive one of two release plates respectively. Each release plate has a hook so as to hook one of two recesses of a terminal board respectively. A spring is connected between the two release plates so that the two hooks can pull each other. The two hooks are removed from the terminal board simply by pushing the two release plates.

The present invention is described at the following drawings which show, for purposes of illustration only, a preferred embodiment in accordance with the present invention.

DETAILED DESCRIPTION OF THE PREFERRED EMBODIMENT

Figure 1:
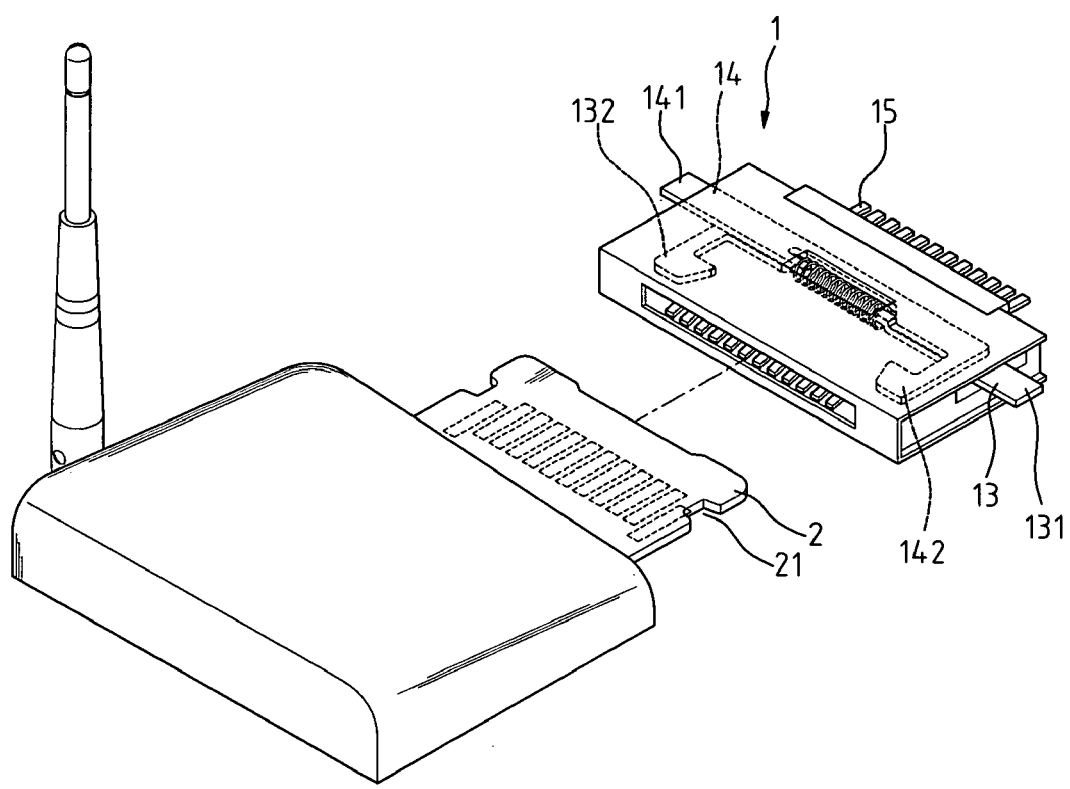
FIG. 1 is an exploded view showing a terminal board and a connector of the present invention.
Figure 2:
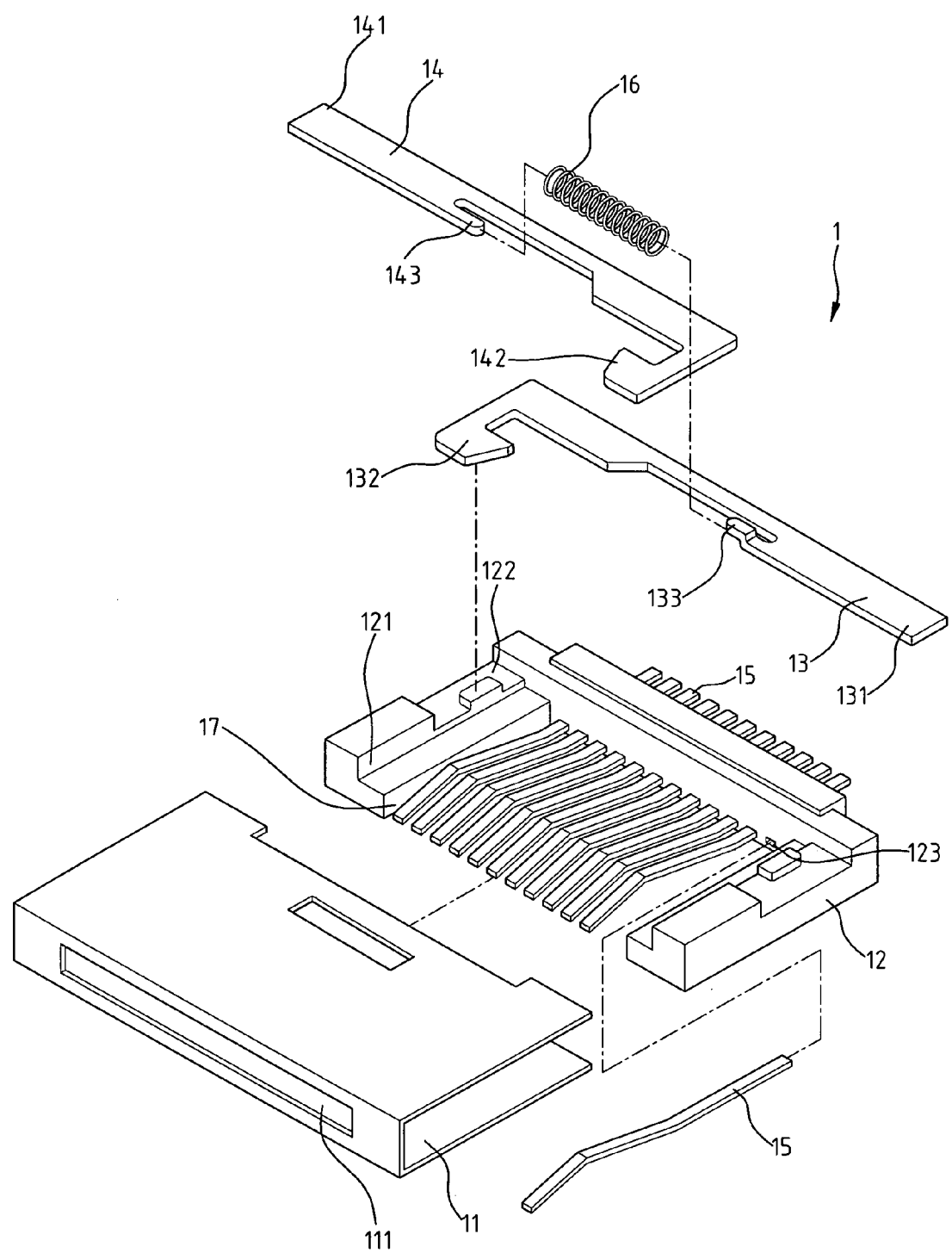
FIG. 2 is an exploded view showing the connector of the present invention.

Referring to FIGS. 1 and 2, a connector 1 in accordance with the present invention comprises a case 11 having a top plate, a bottom plate and a front plate connected between the top plate and the bottom plate. An elongated hole 111 is defined through the front plate. A base 12 is received in a space 11 between the top plate and the bottom plate of the case 11 and has a plurality of contact terminals 15 extending through holes 123 defined through a rear frame of the base 12. A first end of each contact terminal 15 extends from an outside of the rear frame so as to be connected to a part, which is not shown. Two side frames are connected to the rear frame and the second ends of the contact terminals 15 are located in a space 17 between the two side frames of the base 12. Each contact terminal 15 has a bent portion which conveniently contacts with contacted points on a terminal board 2. The second ends of the contact terminals 15 can be accessible from the elongated hole 111.

Figure 4:
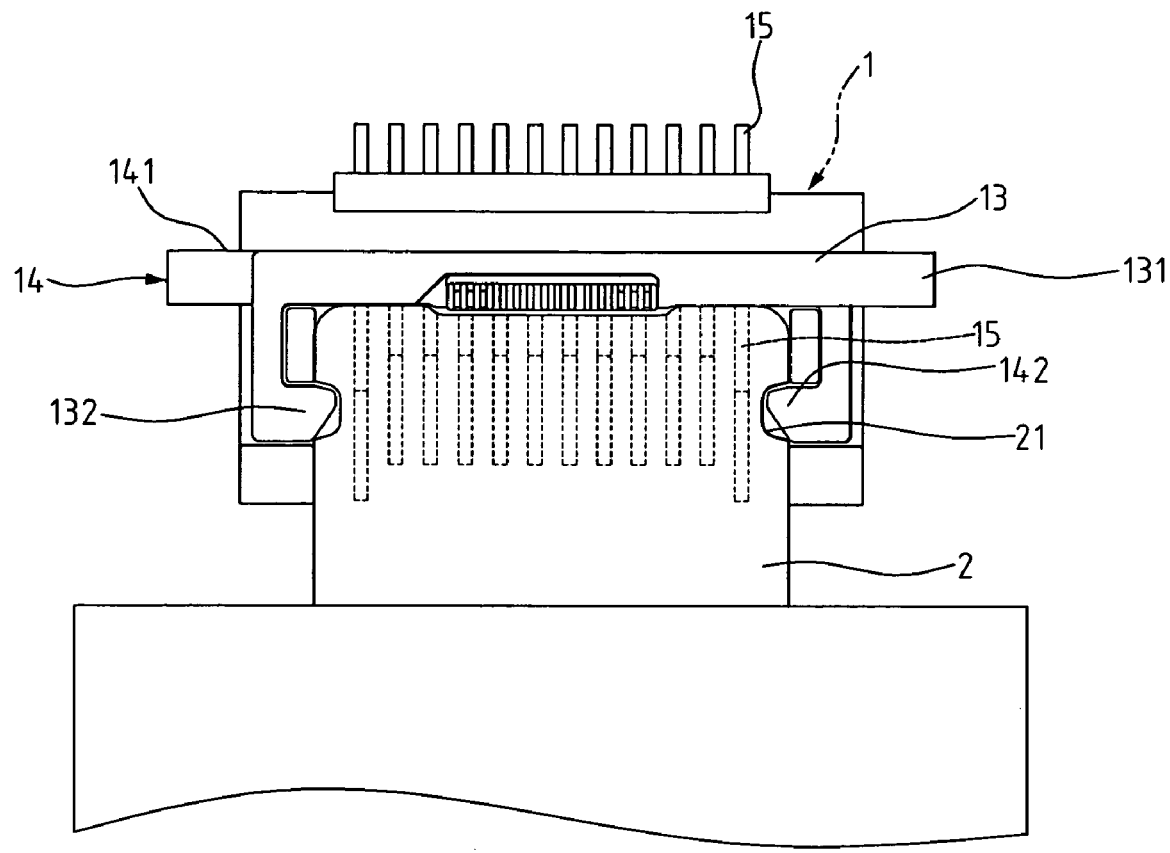
FIG. 4 shows that the terminal board is hooked by the two hooks of the two release plates.

Each side frame has a slot 122 defined therein and two release plates 13, 14 extend through the two slots 122 of the two side frames respectively. Each release plate has a hook 132/142 which may hook one of two recesses 21 of the terminal board 2 respectively as shown in FIG. 4. A guide groove 121 is defined in each of the two side frames of the base 12 so as to guide two sides of the terminal board 2 to be inserted in the case 11. The two release plates 13, 14 are overlapped with each other and each release plate 13/14 has a protrusion 133/143 extending from a mediate portion thereof. The two protrusions 133, 143 extend toward each other and a spring 16 is biased toward the two protrusions 133, 143 so as to pull the two hooks 132, 142 toward each other. Each of the two release plates 13, 14 has a pushing end 131/141 which is exposed on an outside of the base 12 and can be conveniently pushed.

Figure 3:
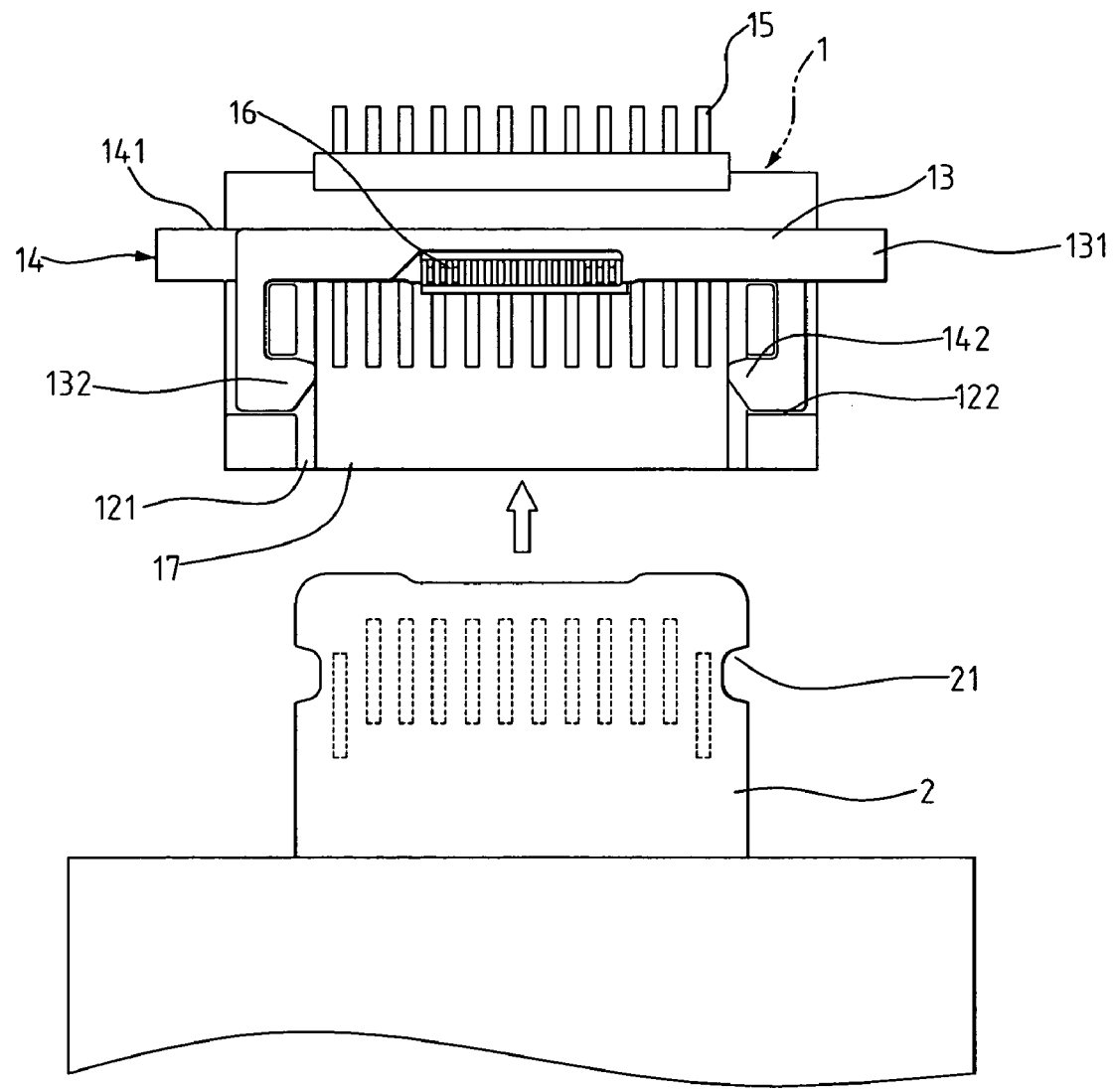
FIG. 3 shows that the terminal board is to be inserted in the connector.
Figure 5:
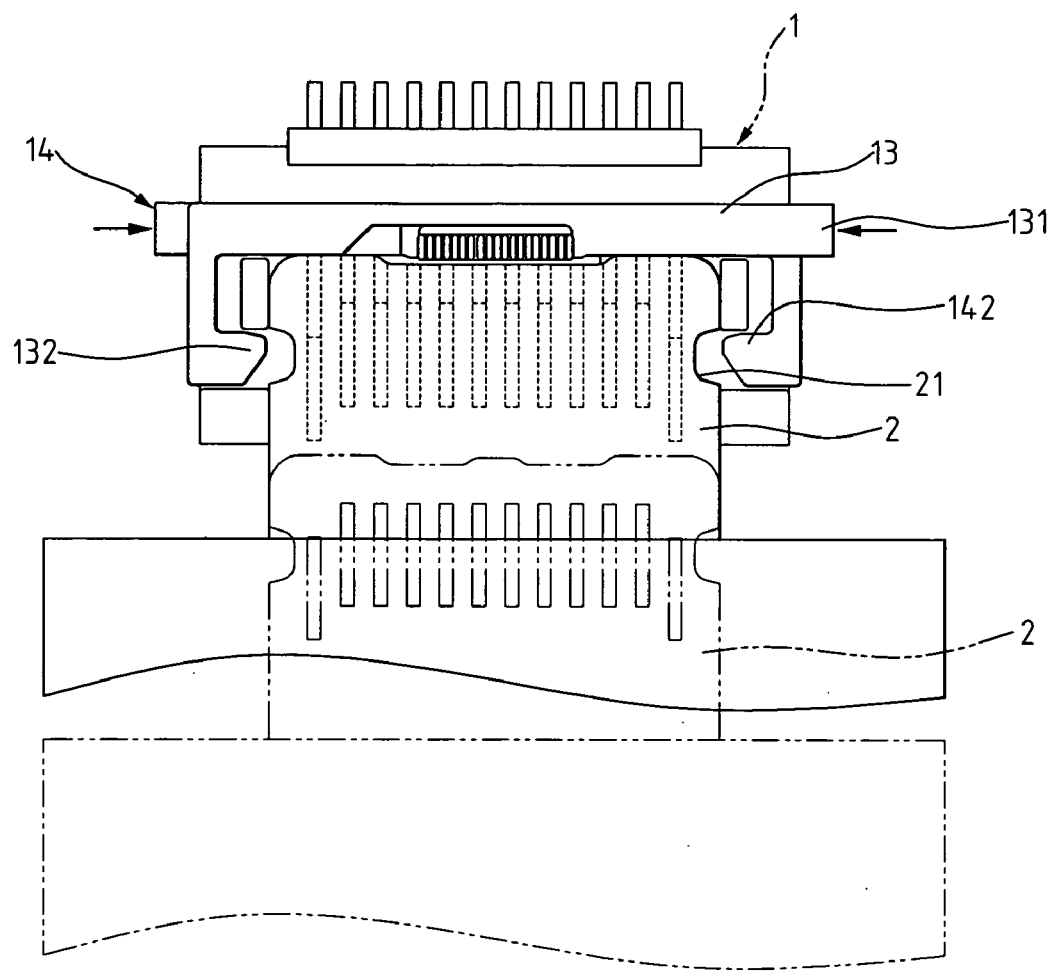
FIG. 5 shows that the two hooks are disengaged from the terminal board by pushing the release plates.

As shown in FIG. 3 to 5, each of the two hooks 132, 142 includes an inclined leading edge so that when the terminal board 2 is inserted through the elongated hole 111, the two hooks 132, 142 are pushed aside by the terminal board 2 pushing the inclined leading edges, till the hooks 132, 142 are engaged with the two recesses 21 of the terminal board 2. As shown in FIG. 5, when the user pushes the two pushing ends 131, 141 of the two release plates 13, 14, the spring 16 is compressed and the two hooks 132, 142 are moved away from the recesses 21 of the terminal board 2. By this way, the connector 1 is easily disengaged from the terminal board 2.

While we have shown and described the embodiment in accordance with the present invention, it should be clear to those skilled in the art that further embodiments may be made without departing from the scope of the present invention.

What is claimed is:

1. A connector comprising:
a base having a plurality of contact terminals extending through a rear frame of the base, a first end of each contact terminal extending from an outside of the rear frame and a second end of each contact terminal located in a space of the base, two side frames connected to the rear frame and the second ends of the contact terminals located between the two side frames, each side frame having a slot defined therein, and
two release plates extending through the two slots of the two side frames respectively and each having a hook adapted to hook one of two recesses of a terminal board respectively, the two release plates being overlapped with each other and each release plate having a mediate portion, a spring connected to the mediate portions of the two release plates so as to pull the two hooks toward each other.

2. The connector as claimed in claim 1, wherein each of the two hooks includes an inclined leading edge.

3. The connector as claimed in claim 1, wherein the mediate portion of each of the release plates has a protrusion and two ends of the spring are mounted onto the two protrusions.

4. The connector as claimed in claim 1 further comprising a guide groove defined in each of the two side frames of the base so as to be adapted to guide the terminal board.

5. A connector comprising:
- a case having a top plate, a bottom plate and a front plate which is connected between the top plate and the bottom plate, an elongate hole defined through the front plate;
- a base having a plurality of contact terminals extending through a rear frame of the base, a first end of each contact terminal extending from an outside of the rear frame and a second end of each contact terminal located in a space of the base, two side frames connected to the rear frame and the second ends of the contact terminals located between the two side frames, each side frame having a slot defined therein, the base being received in a space between the top plate and the bottom plate of the case, the second ends of the contact terminals being accessible from the elongate hole; and
- two release plates extending through the two slots of the two side frames respectively and each having a hook which is adapted to hook one of two recesses of a terminal board respectively, the two release plates being overlapped with each other and each release plate having a protrusion extending from a mediate portion thereof, the two portions extending toward each other and a spring being biased toward the two protrusions so as to pull the two hooks toward each other.

6. The connector as claimed in claim 5, wherein each of the two hooks includes an inclined leading edge.

7. The connector as claimed in claim 5 further comprising a guide groove defined in each of the two side frames of the base so as to be adapted to guide the terminal board.

* * * * *